US007965147B2

(12) United States Patent
Strabley et al.

(10) Patent No.: US 7,965,147 B2
(45) Date of Patent: Jun. 21, 2011

(54) PHYSICS PACKAGE DESIGN FOR A COLD ATOM PRIMARY FREQUENCY STANDARD

(75) Inventors: Jennifer S. Strabley, Maple Grove, MN (US); Daniel W. Youngner, Maple Grove, MN (US); Thomas Ohnstein, Roseville, MN (US); Douglas P. Mortenson, Maple Grove, MN (US); Terry D. Stark, Golden Valley, MN (US); Alan B. Touchberry, St. Louis Park, MN (US); Bernard Fritz, Eagan, MN (US); William Platt, Forest Lake, MN (US); Delmer L. Smith, Edina, MN (US)

(73) Assignee: Honeywell International Inc., Morristown, NJ (US)

( * ) Notice: Subject to any disclaimer, the term of this patent is extended or adjusted under 35 U.S.C. 154(b) by 236 days.

(21) Appl. No.: 12/484,878

(22) Filed: Jun. 15, 2009

(65) Prior Publication Data

US 2010/0033255 A1 Feb. 11, 2010

Related U.S. Application Data

(60) Provisional application No. 61/087,947, filed on Aug. 11, 2008.

(51) Int. Cl.
*H03L 7/26* (2006.01)

(52) U.S. Cl. ............................ 331/94.1; 331/3; 250/251

(58) Field of Classification Search ................. 331/94.1, 331/3; 250/251
See application file for complete search history.

(56) References Cited

U.S. PATENT DOCUMENTS

| | | | | |
|---|---|---|---|---|
| 5,528,028 | A * | 6/1996 | Chu et al. | 250/251 |
| 6,215,366 | B1 | 4/2001 | Kern et al. | |
| 6,303,928 | B1 | 10/2001 | Buell et al. | |
| 6,570,459 | B1 | 5/2003 | Nathanson et al. | |
| 6,772,630 | B2 * | 8/2004 | Araya | 73/382 R |
| 6,900,702 | B2 | 5/2005 | Youngner et al. | |
| 7,323,941 | B1 | 1/2008 | Happer et al. | |
| 7,379,486 | B2 | 5/2008 | Lust et al. | |
| 7,446,618 | B2 | 11/2008 | Koyama | |
| 7,468,637 | B2 | 12/2008 | Braun et al. | |
| 2006/0022761 | A1 | 2/2006 | Abeles et al. | |
| 2007/0034809 | A1 | 2/2007 | Lal et al. | |
| 2007/0200643 | A1 | 8/2007 | Dimarcq et al. | |
| 2008/0267232 | A1 | 10/2008 | DeNatale | |

OTHER PUBLICATIONS

European Patent Office, "European Search Report", Dec. 17, 2010, Published in: EP.

* cited by examiner

*Primary Examiner* — Robert Pascal
*Assistant Examiner* — James E Goodley
(74) *Attorney, Agent, or Firm* — Fogg & Powers LLC

(57) ABSTRACT

A physic package for an atomic clock comprising: a block made of optical glass, a glass ceramic material or another suitable material that includes a plurality of faces on its exterior and a plurality of angled borings that serve as a vacuum chamber cavity, light paths and measurement bores; mirrors fixedly attached using a vacuum tight seal to the exterior of the block at certain locations where two light paths intersect; optically clear windows fixedly attached using a vacuum tight seal to the block's exterior over openings of the measurement bores and at one location where two light paths intersect; and fill tubes fixedly attached using a vacuum tight seal to the exterior of the block over the ends of the vacuum chamber cavity. This physics package design makes possible atomic clocks having reduced size and power consumption and capable of maintaining an ultra-high vacuum without active pumping.

20 Claims, 4 Drawing Sheets

PHYSICS PACKAGE DESIGN FOR A COLD ATOM PRIMARY FREQUENCY STANDARD

CROSS REFERENCE TO RELATED APPLICATIONS

This application is related to and claims the benefit of U.S. Provisional Application Ser. No. 61/087,947 filed Aug. 11, 2008, the disclosure of which is incorporated herein by reference in its entirety.

This application is related to U.S. patent application Ser. No. 12/484,899, filed on even date herewith, entitled "COLD ATOM MICRO PRIMARY STANDARD," which is incorporated herein by reference.

BACKGROUND OF THE INVENTION

Primary frequency standards are atomic clocks that do not need calibration and can run autonomously for long periods of time with minimal time loss. One such atomic clock utilizes an expanding cloud of laser cooled atoms of an alkali metal such as cesium (Cs) or rubidium ("Rb") in the non-electronic portion of the atomic clock. The non-electronic portion of an atomic clock is sometimes referred to as the physics package. Usually these primary frequency standards and the corresponding physics packages are large and consume a lot of power. While some progress has been made in reducing the size and power consumption of primary frequency standards and their physics packages, further such reductions have been difficult to achieve for both military and civilian applications.

SUMMARY OF THE INVENTION

Embodiments of a physics package provide a small chamber device that stores cold atoms that serve as a primary frequency standard device as described below. More particularly, the small chamber device is a physics package for use in atomic sensors (including accelerometers), especially in an atomic clock. The physics package is built around a block comprising optical glass, a glass ceramic material, or some other appropriate material. The exterior of the block is shaped to have a plurality of faces positioned at predetermined angles to one another. The shape of the block accommodates a plurality of angled borings that are bored through the block of which serve as a vacuum chamber cavity for an alkali metal such as rubidium, light paths for a beam of light from a light source such as a laser, and measurement ports. An optically clear window or mirror such as those having a metal or dielectric stack coating is fixedly attached using a vacuum tight seal to the exterior of the block over the bored paths. Fill tubes made of an appropriate material such as a nickel-iron alloy are fixedly attached using a vacuum tight seal to the exterior of the block at each end of the vacuum chamber cavity. The fill tubes are used for various purposes including introducing rubidium into the vacuum chamber of the physics package and pumping out the interior of the physics package to obtain a vacuum of an appropriate level. After this is done, the fill tubes are sealed to obtain a vacuum tight seal and maintain the vacuum.

One embodiment of a physics package for an atomic clock includes: a block that includes a plurality of faces on the exterior of the block positioned at predetermined angles to one another, a central bore that extends from one of the faces of the block through the block to an opposing face of the block, wherein the central bore is terminated with fill tubes, one or more measurement bores, each of which extends from one of the faces of the block through the block to the central bore, and a plurality of light paths, each of which extends from one of the faces of the block at a predetermined angle relative to the angle of the face from which it extends through the block to another face of the block, wherein each of the light paths intersects with at least a portion of the central bore in the interior of the block and with one other of the light paths at one of the faces of the block; a plurality of optically clear windows, one of which is fixedly attached using a vacuum tight seal to one of the faces of the block over one of the locations where one of the light paths intersects with one other of the light paths and the remainder of which are fixedly attached using a vacuum tight seal over exterior openings of the measurement bores; a plurality of mirrors, each of which is fixedly attached using a vacuum tight seal to one of the faces of the block over the other locations where one of the light paths intersects with one other of the light paths; and an inlet fill tube fixedly attached using a vacuum tight seal to one of the faces of the block over one end of the central bore and an outlet fill tube fixedly attached using a vacuum tight seal to the opposing face of the block over the other end of the vacuum chamber cavity.

BRIEF DESCRIPTION OF THE DRAWINGS

Like reference numbers and designations in the various drawings indicate like elements.

DETAILED DESCRIPTION OF THE PREFERRED EMBODIMENTS

Figure 1:
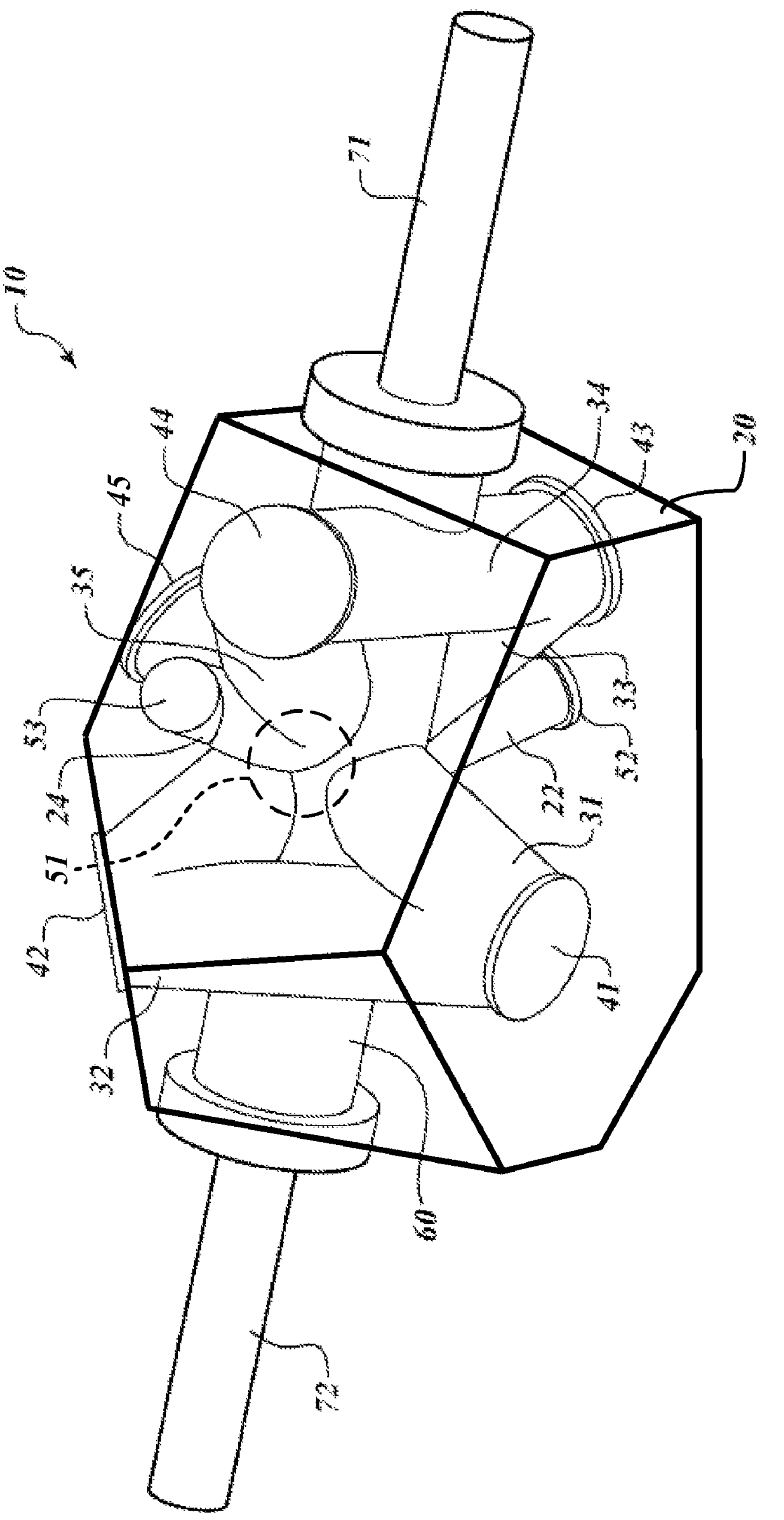
FIG. 1 is a schematic, x-ray view of one embodiment of a physics package for an atomic clock.

FIG. 1 is a schematic, x-ray view of one embodiment of a physics package 10 for an atomic clock. The physics package 10 includes: a block 20; a first measurement bore 22 and a second measurement bore 24 bored in the block 20; a plurality of light paths referred to generally as light paths 30 bored in the block 20, comprising a first light path through a fifth light path, 31 through 35, respectively; a plurality of mirrors referred to generally as mirrors 40 fixedly attached to the exterior of the block 20 at locations where certain of the light paths 30 intersect, including a first mirror through a fifth mirror, 41 through 45, respectively; a plurality of optically clear windows referred to generally as windows 50, including a first window 51 (the first window 51 is shown as a dashed line, indicating the first window 51 is on the backside of the physics package 10) fixedly attached to the exterior of the block 20 at one of the locations where certain of the light paths 30 intersect, a second window 52 fixedly attached to the exterior opening of the first measurement bore 22 and a third window 53 fixedly attached to the exterior opening of the second measurement bore 24; a central bore 60 bored in the block 20; and fill tubes 70 including an inlet fill tube 71 and an outlet fill tube 72 fixedly attached to the block 20 over each end of the central bore 60.

The plurality of the light paths 30 are bored in the block 20 in a geometric arrangement of angled borings so that only a single light source (not shown), such as a laser, needs to be used in the atomic clock. This arrangement also allows the plurality of mirrors 40 to direct a beam of light (not shown) from the single light source down the light paths 30 of the block 20. The exterior of the block 20 is shaped to accommodate this geometric arrangement of angled borings for the light paths 30. The fill tubes 70 could be used to put an alkali metal (such as rubidium, cesium, or any other suitable alkali metal) needed for operation of the atomic clock into the system and to pump out the interior of the block 20 to create a vacuum. For example, the fill tubes 70 can be used to place an alkali metal capsule or container into the chamber before evacuation. After this is done, the fill tubes are sealed to obtain a vacuum tight seal and maintain the vacuum using various techniques, including, for example, pinching and welding. The chamber is evacuated to produce a vacuum, sealed, and then the alkali metal is released into the chamber under vacuum by crushing the capsule (or by another suitable technique). In other words, the alkali metal is introduced into the chamber before evacuation, but the alkali atoms are not released until after evacuation and sealing.

The fill tubes 70 can also serve as electrodes for forming a plasma for discharge cleaning of the physics package 10 and to enhance pump down (that is, pumping the cavity) and bake out (that is, heating the block 20 to hasten evacuation) of the physics package 10. Implementations of the physics package 10 shown in FIG. 1 contain gettering material to limit the partial pressures of some gasses (such as hydrogen).

Functionally, the physics package 10 shown in FIG. 1 operates in an atomic clock in the following manner. A beam of light (not shown) from a single light source (not shown) such as a Vertical Cavity Surface Emitting Laser ("VCSEL") or other type of laser, is directed into the physics package 10 through the first window 51 into the first light path 31. The light beam then travels down the first light path 31 through the central bore 60 to the fourth mirror 44. The fourth mirror 44 next reflects the light beam down the second light path 34 through the central bore 60 to the third mirror 43. The third mirror 43 then reflects the light beam down the third light path 33 through the central bore 60 to the second mirror 42. The second mirror 42 next reflects the light beam down the fourth light path 32 through the central bore 60 to the first mirror 41. The beam of light is then reflected by the first mirror 41 down the first light path 31. The beam of light retro-reflects off the fifth mirror 45 and retraces its path to exit the block 20 through the first window 51. The effect of this is that the plurality of mirrors 40 directs the beam of light from the single light source down the light paths 30 of the block 20 so as to create three retro-reflected beams that cross at 90° angles to one another. A clock signal is read through the first measurement bore 22 and the second measurement bore 24 using photodiodes (not shown) that are positioned outside of and attached to the second window 52 and the third window 53. In alternative embodiments of the physics package 10, other numbers of measurement ports are used.

Various materials and methodologies can be used to construct the components of the physics package 10. Suitable materials for construction of the block 20 include, for example, glass ceramic materials such as MACOR® and optical glass such as BK-7 or Zerodur. In general, the material used to construct the block should have the following properties: be vacuum tight, non-permeable to hydrogen or helium and non-reactive with the material to be introduced into the central bore 60 (for example, rubidium). Other properties the block 20 has include low permeability to inert gases (such as Argon), compatibility with frit bonding to connect the mirrors 40 to the outer surface of the block 20, and the block 20 can be baked at high temperatures (such as over 200 degrees Celsius). The block 20 can be fabricated using various methodologies. In one embodiment of the physics package, in which the block 20 is made of a glass ceramic material, a solid piece of the material is cut to the desired size and shaped to accommodate the desired geometric arrangement of the light paths 30. The light paths 30 and the central bore 60 are then bored into the sized and shaped block 20. The volume of the block 20 so produced can range from about 1 $cm^3$ to about 5 $cm^3$. The diameter of the light paths 30 of the block 20 will depend on the volume of the block 20 and allows for sizes as small as 1 $cm^3$. The diameter of the central bore 60 of the block 20 will also depend on the volume of the block 20

Following fabrication of the block 20, construction of the physics package 10 is completed by attaching the other components of the physics package 10 to the block 20. In general, the plurality of mirrors 40, the plurality of optically clear windows 50, and the fill tubes 70 must be attached to the block 20 using materials and techniques that result in a seal that maintains a vacuum in the physics package 10 without active pumping. A vacuum pressure on the order of approximately $10^{-7}$ to $10^{-8}$ torr is acceptable. In one embodiment of the physics package 10, the plurality of mirrors 40 is fixedly attached to the exterior of the block 20 at certain locations where some of the light paths 30 intersect using various techniques to create a vacuum tight seal. Various types of mirrors can be used in the physics package 10, including, for example, highly reflective, optically smooth mirrors that have a single or multilayer metal or dielectric stack coating. The mirrors 40 can be plane mirrors or curved mirrors to slightly focus the beam of light as necessary. The size of the mirrors 40 will depend on the volume of the block 20. The plurality of the optically clear windows 50 are then fixedly attached to the exterior openings of the first measurement bore 22 and the second measurement bore 24 using various well-known techniques such as frit sealing to create a vacuum tight seal. Suitable materials for construction of the optically clear windows 50 include, for example, BK-7 glass which has an anti-reflection coating. The size of the windows 50 will depend on the volume of the block 20. In an alternate embodiment of the physics package, the mirrors 40 or the optically clear windows 50 or both are positioned in the interior of the block 20 in a vacuum tight manner. The fill tubes 71 and 72 are next fixedly attached to the central bore 60 of the block 20 using various techniques to create a vacuum tight seal, such as frit sealing or using a swage-lock or O-ring. Suitable materials for the inlet fill tube 71 and the outlet fill tube 72 include, for example, nickel, iron, aluminum and nickel-iron alloys such as INVAR. The sizes of the inlet fill tube 71 and the outlet fill tube 72 can range from a diameter of about 1 mm to about 5 mm.

Figure 2:
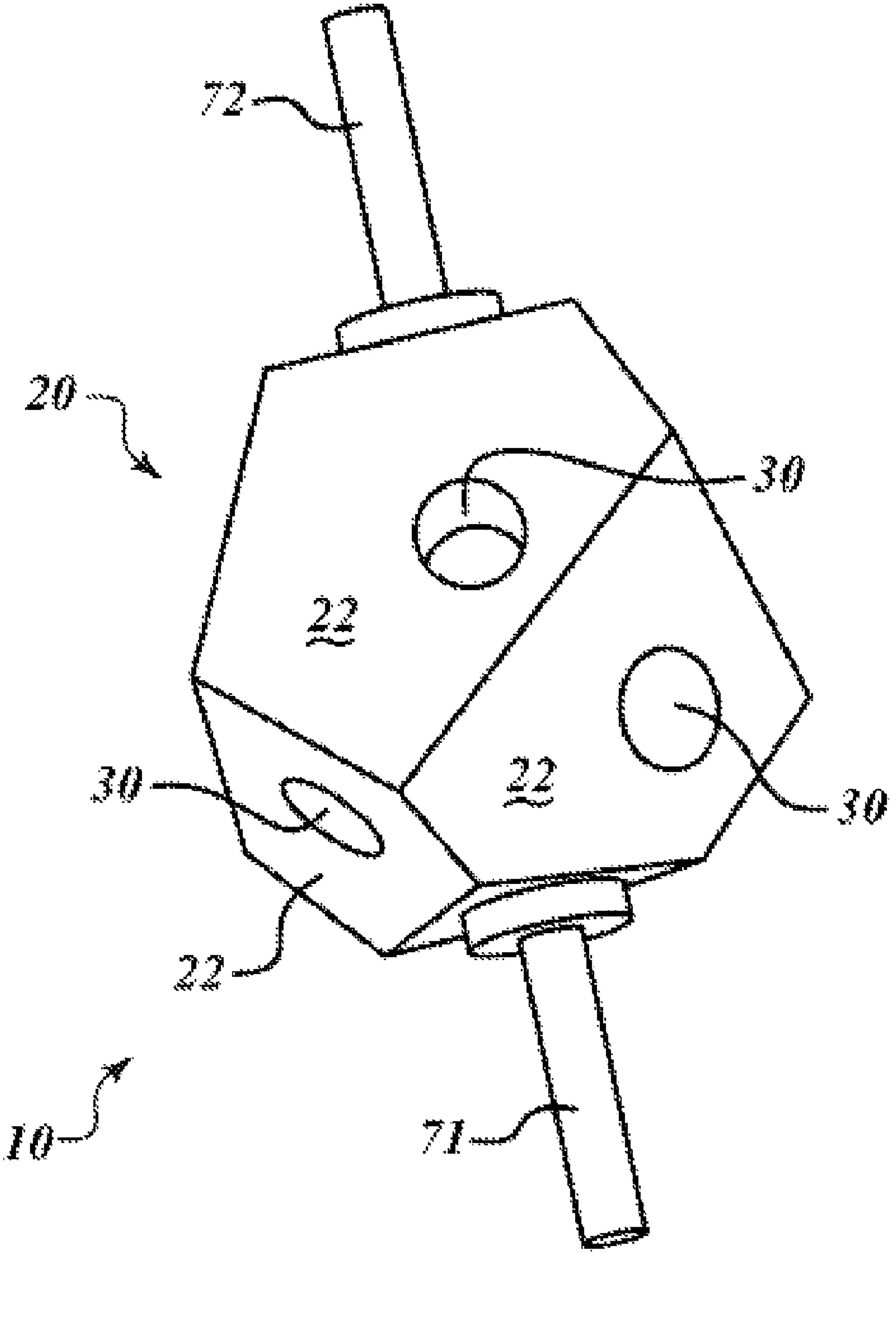
FIG. 2 is a perspective, exterior view of one embodiment of a physics package for an atomic clock.

FIG. 2 is a perspective, exterior view of one embodiment of a physics package 10 for an atomic clock. Visible in FIG. 2 and as set forth above, the physics packages 10 include the block 20, the plurality of light paths 30, the inlet fill tube 71 and the outlet fill tube 72. The block 20 is shaped to include a plurality of faces 22 on the exterior of the block positioned at predetermined angles to one another. This shape accommodates the geometric arrangement of angled borings for the light paths 30.

Figure 3:
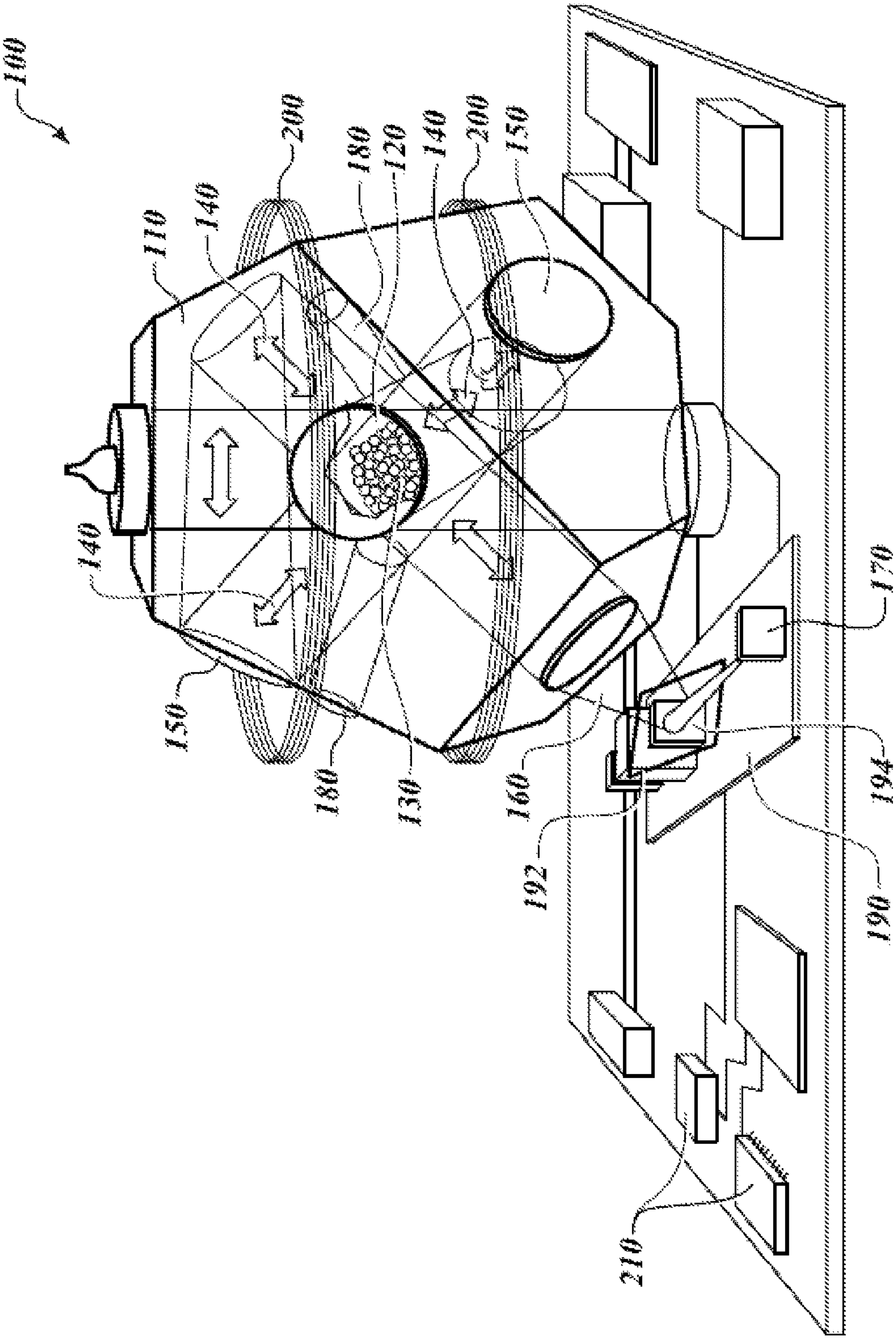
FIG. 3 is a schematic view of one embodiment of a physics package incorporated in an atomic clock.

FIG. 3 is a schematic view of one embodiment of a physics package incorporated in a sensor apparatus 100. The sensor apparatus 100 is an atomic sensor (such as an accelerometer or an atomic clock) comprising a physics package 110. In the embodiment shown in FIG. 3, the sensor apparatus 100 is an atomic clock. The physics package 110 comprises a vacuum chamber cavity 120 that holds alkali metal atoms 130 such as rubidium or cesium (for example, Rb-87) in a passive vacuum (with or without gettering agents), an arrangement of light paths 140 and mirrors 150 that directs a beam of light 160 from a single laser light source 170 through the physics package 110, and at least one photo-detector port 180 (two are shown in the illustrated embodiment).

The atomic clock 100 also comprises a micro-optical bench 190 that includes the single laser light source 170, for example, a semiconductor laser such as a Vertical Cavity Surface Emitting Laser ("VCSEL"), a distributed feedback laser or an edge emitting laser, a micro-fabricated vapor cell 192 containing an alkali metal such as rubidium or cesium (for example, Rb-87) and a beam splitter 194 for distributing the beam of light 160 to the vapor cell 192 and the physics package 110. The atomic clock 100 further comprises a plurality of magnetic field coils 200 (two are shown in the illustrated embodiment), such as Helmholtz and anti-Helmholtz coils, for generating magnetic fields.

The atomic clock 100 shown in FIG. 3 also comprises control electronics 210. The arrangement of the light paths 140 and mirrors 150 directs the beam of light 160 from the single laser light source 170 through the physics package 110 to create three retro-reflected optical beams that cross at 90° angles relative to one another in the vacuum chamber cavity 120. The optical beams and a magnetic field produced by the magnetic field coils 200 are used in combination to slow, cool, and trap the alkali metal atoms 130 (for example, Rb-87 atoms) from the background vapor and trap the Rb-87 atoms 40 (about 10 million atoms at a temperature of about 20 μK at the center of the intersection of the optical beams) in the MOT. The folded-retroreflected beam path makes efficient use of the single light source 170. The mirrors 150 (for example, dielectric mirrors) and diffractive optics are used to steer the optical beams and control the polarization of the optical beams, respectively, while minimizing scattered light and size. The vapor cell 192 containing an alkali metal is used to frequency stabilize the beam of light 160 from the single laser light source 170 to a predetermined atomic transition of the alkali metal.

Embodiments of the atomic clock 100 also comprise a Local Oscillator ("LO") (not shown), an antenna (not shown), a photo-detector (not shown). One photo-detector is used for each photo-detector port 180 in FIG. 3. The LO is used to generate a microwave signal corresponding to the predetermined atomic transition of the alkali metal. The antenna is used to deliver the microwave signal from the LO to the alkali metal atoms 130 of the physics package 110. Photo-detectors are used for detecting the fluorescence of the alkali metal atoms 130 (for example, Rb-87 atoms).

Figure 4:
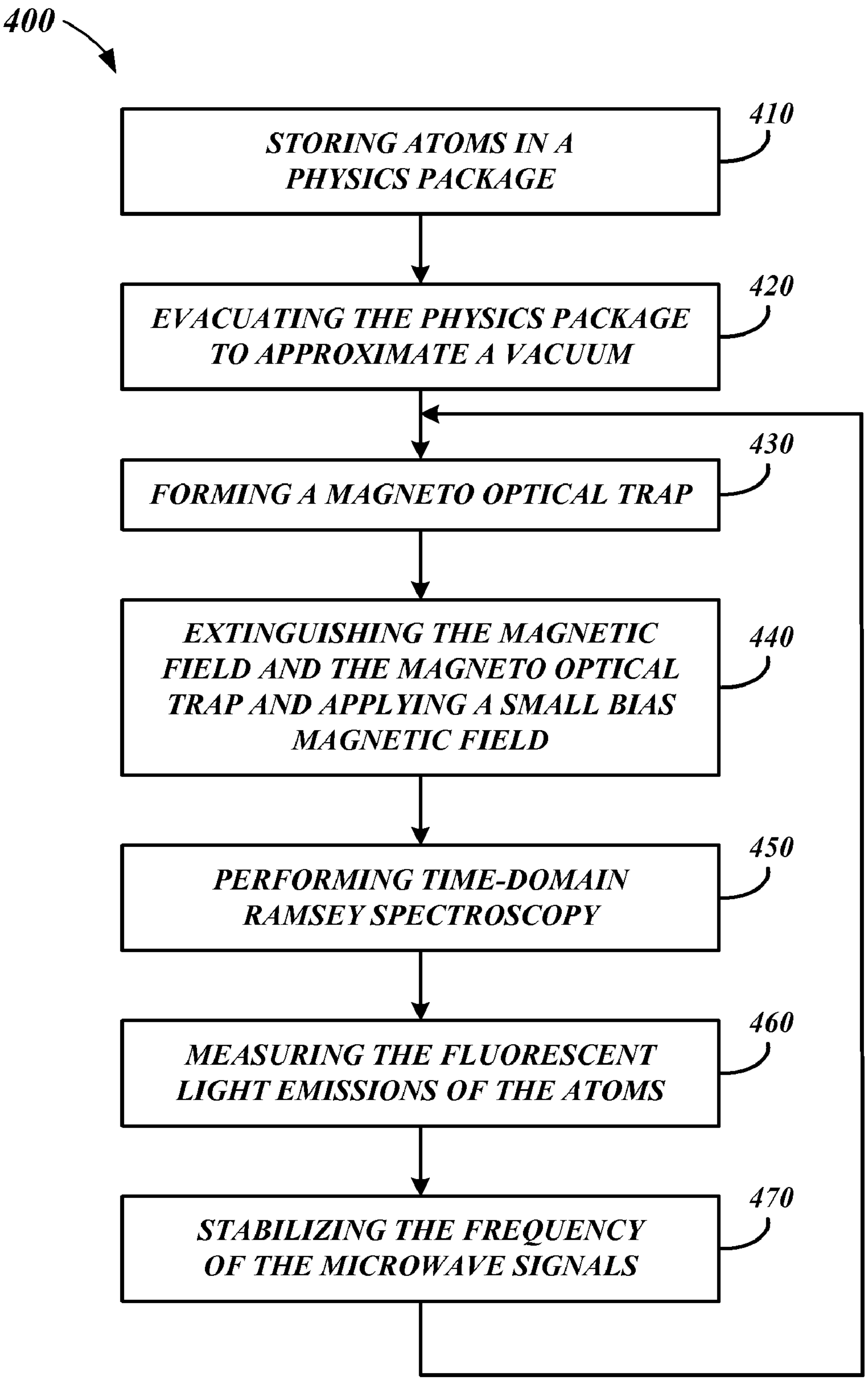
FIG. 4 is a flowchart depicting one embodiment of a method of operating a physics package for use in forming a precision frequency standard.

FIG. 4 is a flowchart depicting one embodiment of a method 400 of operating a physics package for use in forming a precision frequency standard. The method 400 comprises storing atoms in a physics package (block 410). The method 400 also comprises evacuating the physics package to approximate a vacuum (block 420). Embodiments of the vacuum comprise a pressure of less than about $1\times10^{-8}$ torr. In some embodiments of the method of operating a physics package, storing atoms in the physics package (block 410) and evacuating the physics package to approximate a vacuum (block 420) are performed only once.

The method 400 further comprises forming a magneto optical trap using a magnetic field and a beam of light from a light source, wherein the light enters the physics package through one of the optically clear windows and is retro-reflected through a plurality of the light paths (block 430). Embodiments of the method 400 of operating a physics package for use in forming a precision frequency standard further comprise extinguishing the magnetic field and the magneto optical trap and applying a small bias magnetic field to allow the atoms to move from a higher energy state to a lower energy state (block 440). A time-domain Ramsey spectroscopy or Rabi spectroscopy using microwave signals generated by a local oscillator and coupled to the atoms by an antenna to probe the frequency splitting of the atoms is performed (block 450). The method 400 further comprises measuring the florescent light emissions of the atoms (block 460) with a photodetector to determine the fraction of the atoms in the higher ground state energy level and stabilizing the frequency of the microwave signals generated by the local oscillator to the frequency that maximizes the number of atoms in the higher energy state (block 470). The LO frequency corresponds with the energy level splitting between the two ground hyperfine levels. In some embodiments of the method 400, some of the blocks are repeated to maintain a clock signal and lock the LO onto the atomic resonance. For example, block 430 through block 470 may be looped while operating the physics package.

The physics package design allows the use of only a single light/laser beam (instead of 6 individual beams or 3 sets of retro-reflected beams or some combination) in an atomic clock. The positioning of the mirrors and the angled borings allows the single light/laser beam to be steered by the mirrors around the physics package to create three retro-reflected beams that cross at 90° angles relative to one another. The clock signal is read using photodiodes that are positioned outside of and attached to one or more of the optically clear windows.

The foregoing physics package design makes possible the production of atomic clocks that have a number of distinct advantages when compared to existing atomic clocks. Such advantages include reduced size and power consumption, the ability to maintain an ultra-high vacuum without active pumping, and compatibility with high volume manufacturing.

While embodiments of the invention have been illustrated and described, as noted above, many changes can be made without departing from the spirit and scope of the invention. Features described with respect to one embodiment can be combined with, or replace, features of another embodiment. Accordingly, the scope of the invention is not limited by the disclosure of the preferred embodiment. Instead, the invention should be determined entirely by reference to the claims that follow.

What is claimed is:

1. A physics package apparatus for an atomic clock comprising:

a block that comprises:

- a plurality of faces on an exterior of the block positioned at predetermined angles to one another;
- a central bore that extends from one of the faces of the block through the block to an opposing face of the block;
- one or more measurement bores, each of which extends from one of the faces of the block through the block to the central bore;
- a plurality of light paths, each of which extends from one of the faces of the block at a predetermined angle relative to the angle of the face from which it extends through the block to another face of the block, wherein each of the light paths intersects with one other of the light paths at one of the faces of the block;
- a plurality of optically clear windows, one of which is fixedly attached using a vacuum tight seal to one of the faces of the block over one of the locations where one of the light paths intersects with one other of the light paths and the remainder of which are fixedly attached using a vacuum tight seal over exterior openings of the measurement bores;

a plurality of mirrors, each of which is fixedly attached using a vacuum tight seal to one of the faces of the block over the other locations where one of the light paths intersects with one other of the light paths;

an inlet fill tube fixedly attached using a vacuum tight seal to a first face of the block; and an outlet fill tube fixedly attached using a vacuum tight seal to a second face of the block.

2. The apparatus of claim 1, wherein the vacuum tight seals are frit seals.

3. The apparatus of claim 1, wherein the block comprises one of a glass ceramic material, MACOR, optical glass, and BK-7 optical glass.

4. The apparatus of claim 1, wherein the block has a volume of approximately less than 5 $cm^3$.

5. The apparatus of claim 1, wherein the mirrors have a dielectric stack coating.

6. The apparatus of claim 1, wherein the mirrors are plane mirrors or curved mirrors or combinations thereof.

7. The apparatus of claim 1, wherein the optically clear windows comprises BK-7 glass.

8. The apparatus of claim 1, further comprising wherein the first face comprises one end of the central bore and the second face comprises the other end of the central bore.

9. The apparatus of claim 1, wherein the inlet fill tube and the outlet fill tube comprise one of nickel, iron, aluminum, and an alloy.

10. The apparatus of claim 1, wherein the inlet fill tube and the outlet fill tube comprise a nickel-iron alloy.

11. The apparatus of claim 1, wherein an alkali metal has been introduced into the vacuum chamber, the physics package has been evacuated to produce a vacuum and the inlet fill tube and the outlet fill tube have been pinched and sealed to maintain the vacuum.

12. The apparatus of claim 11, wherein the alkali metal is rubidium.

13. The apparatus of claim 11, wherein the vacuum has a pressure of about $10^{-8}$ torr.

14. A method of operating a physics package for use in forming a precision frequency standard, comprising:

storing atoms in the physics package, wherein the physics package comprises:

a block having a plurality of faces, wherein the block comprises:

a central bore that extends from one of the plurality of faces to an opposing face;

a plurality of measurement bores, each of which extends from one of the faces of the block through the block to the central bore; and a plurality of light paths, each of which extends from one of the plurality of faces to an opposing face;

a plurality of mirrors, each of which is fixedly attached using a vacuum tight seal to one of the faces of the block over one end of the plurality of light paths; and a plurality of optically clear windows, each of which is fixedly attached using a vacuum tight seal to one of the faces of the block over one of the plurality of measurement bores;

evacuating the physics package to approximate a vacuum; and forming a magneto optical trap using a magnetic field and a beam of light from a light source, wherein the light enters the physics package through one of the optically clear windows and is retro-reflected through a plurality of the light paths.

15. The method of claim 14, further comprising:

extinguishing the magnetic field and the magneto optical trap and applying a small bias magnetic field to allow the atoms to move from a higher energy state to a lower energy level;

performing spectroscopy using microwave signals generated by a local oscillator and coupled to the atoms by an antenna to probe the frequency splitting of the atoms;

measuring the florescent light emissions of the atoms with a photo-detector to determine the fraction of the atoms in the higher energy state; and stabilizing the frequency of the microwave signals generated by the local oscillator to the frequency that maximizes the number of atoms in the higher energy state.

16. The method of claim 15, wherein the atoms comprise an alkali metal.

17. An atomic sensor assembly, the assembly comprising:

an atomic sensor;

a light source;

a physics package, comprising a block that comprises:

a plurality of faces on an exterior of the block positioned at predetermined angles to one another;

a central bore that extends from one of the faces of the block through the block to an opposing face of the block;

one or more measurement bores, each of which extends from one of the faces of the block through the block to the central bore;

a plurality of light paths, each of which extends from one of the faces of the block at a predetermined angle relative to the angle of the face from which it extends through the block to another face of the block, wherein each of the light paths intersects with one other of the light paths at one of the faces of the block;

a plurality of optically clear windows, one of which is fixedly attached using a vacuum tight seal to one of the faces of the block over one of the locations where one of the light paths intersects with one other of the light paths and the remainder of which are fixedly attached using a vacuum tight seal over exterior openings of the measurement bores;

a plurality of mirrors, each of which is fixedly attached using a vacuum tight seal to one of the faces of the block over the other locations where one of the light paths intersects with one other of the light paths; and an inlet fill tube fixedly attached using a vacuum tight seal to one of the faces of the block over one end of the central bore and an outlet fill tube fixedly attached using a vacuum tight seal to the opposing face of the block over the other end of the central bore; and at least one photo-detector for detecting light emissions from the physics package.

18. The assembly of claim 17, wherein the atomic sensor is at least one of an accelerometer and an atomic clock.

19. The assembly of claim 17, further comprising:

a micro-optics bench that comprises the light source, a micro-fabricated vapor cell containing an alkali metal for stabilizing the beam of light from the light source to a frequency corresponding to a predetermined atomic transition of the alkali metal, and a distribution mirror for distributing the beam of light from the light source to the vapor cell and the physics package;

a plurality of magnetic field coils for generating a magnetic field, whereby the magnetic field and the retro-reflected optical beams create a magneto optical trap for the alkali metal atoms of the physic package;

a local oscillator for generating a microwave signal corresponding to the predetermined atomic transition of the alkali metal;

an antenna for coupling the microwave signal to the alkali metal atoms of the physic package; and control electronics for providing power to the atomic sensor, controlling the operation of the atomic sensor and processing signals from the photo-detector.

20. The assembly of claim 19, wherein:

the atomic sensor is an atomic clock;

the alkali metal atoms are selected from a group consisting of rubidium and cesium; and the light source is a semiconductor laser.

* * * * *